United States Patent [19]
Roberts

[11] Patent Number: 5,751,630
[45] Date of Patent: May 12, 1998

[54] SRAM CELL EMPLOYING SUBSTANTIALLY VERTICALLY ELONGATED PULL-UP RESISTORS

[75] Inventor: Ceredig Roberts, Boise, Id.

[73] Assignee: Micron Technology, Inc., Boise, Id.

[21] Appl. No.: 815,413

[22] Filed: Mar. 11, 1997

Related U.S. Application Data

[62] Division of Ser. No. 705,589, Aug. 29, 1996, Pat. No. 5,699,292.

[51] Int. Cl.[6] .................. H01L 29/76; H01L 27/02
[52] U.S. Cl. .................. 365/154; 365/174; 365/188; 365/72; 257/379; 257/903; 257/380; 257/538
[58] Field of Search .................. 365/174, 154, 365/188, 72; 257/379, 350, 538, 903, 907; 437/52

[56] References Cited

U.S. PATENT DOCUMENTS

| | | | |
|---|---|---|---|
| 4,178,674 | 12/1979 | Liu et al. ................ | 29/571 |
| 4,575,923 | 3/1986 | Arnold ................ | 29/576 B |
| 4,631,705 | 12/1986 | Honda ................ | 365/182 |
| 4,690,728 | 9/1987 | Tsang et al. ................ | 156/643 |
| 4,828,629 | 5/1989 | Ikeda et al. ................ | 148/33.3 |
| 4,849,801 | 7/1989 | Honjyo et al. ................ | 357/51 |
| 4,961,103 | 10/1990 | Saitoh et al. ................ | 357/59 |
| 5,034,797 | 7/1991 | Yamanaka et al. ................ | 357/42 |
| 5,172,211 | 12/1992 | Godinho et al. ................ | 257/536 |
| 5,177,030 | 1/1993 | Lee et al. ................ | 437/47 |
| 5,321,650 | 6/1994 | Kikuchi et al. ................ | 365/177 |
| 5,365,104 | 11/1994 | Godinho et al. ................ | 257/529 |
| 5,489,796 | 2/1996 | Harward ................ | 257/379 |
| 5,567,644 | 10/1996 | Rolfson et al. ................ | 437/60 |
| 5,683,930 | 11/1997 | Batra et al. ................ | 437/60 |
| 5,699,292 | 12/1997 | Roberts et al. ................ | 365/154 |

FOREIGN PATENT DOCUMENTS

| | | | |
|---|---|---|---|
| 56-43749 A | 4/1981 | Japan ................ | H01L 27/04 |
| 61-164241 A | 7/1986 | Japan ................ | H01L 21/88 |
| 62-140451 A | 6/1987 | Japan ................ | H01L 27/04 |
| 63-133562 A | 6/1988 | Japan ................ | H01L 27/04 |
| 2-303064 A | 12/1990 | Japan ................ | H01L 27/04 |

*Primary Examiner*—Viet Q. Nguyen
*Attorney, Agent, or Firm*—Wells, St. John, Roberts, Gregory & Matkin, PS

[57] ABSTRACT

An SRAM cell having at least four field effect transistors includes, a) at least four transistor gates, a ground line, a Vcc line, and a pair of pull-up resistors; the four transistor gates having associated transistor diffusion regions operatively adjacent thereto; and b) the Vcc line and the ground line being provided in different respective elevational planes, the pull-up resistors being substantially vertically elongated between Vcc and selected of the respective transistor diffusion regions operatively adjacent the gates. In an additional aspect, an SRAM cell having at least four field effect transistors includes, i) at least four transistor gates, an electrical interconnect line, a Vcc line, and a pair of pull-up resistors; the four transistor gates having associated transistor diffusion regions operatively adjacent thereto; and ii) the Vcc line and the electrical interconnect line being provided in different respective elevational planes, the pull-up resistors being substantially vertically elongated between Vcc and selected of the respective transistor diffusion regions operatively adjacent the gates.

8 Claims, 7 Drawing Sheets

_Fig 1_
PRIOR ART

_Fig 2_
PRIOR ART

FIG. 5 ions (SRAMs). A static memory
SRAM CELL EMPLOYING SUBSTANTIALLY VERTICALLY ELONGATED PULL-UP RESISTORS This application is a division of application Ser. No. 08/705,589, filed Aug. 29, 1996 now U.S. Pat. No. 5,699,292.

TECHNICAL FIELD

This invention relates to SRAM cells employing vertically elongated pull-up resistors.

BACKGROUND OF THE INVENTION

Figure 1:
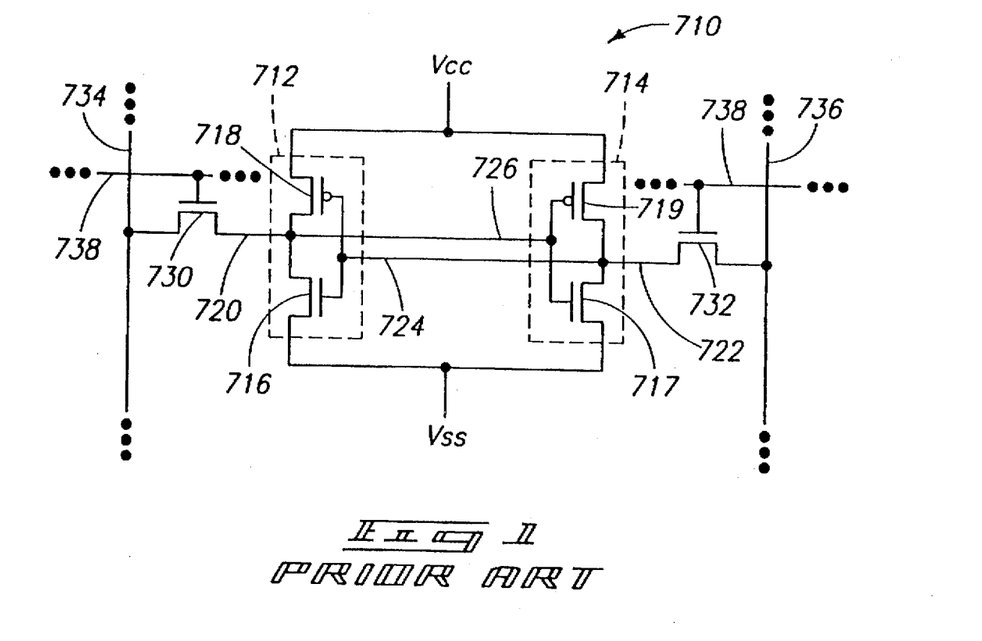
FIG. 1 is a schematic of a prior art SRAM cell.

FIG. 1 shows a prior art six transistor static read/write memory cell 710 such as is typically used in high-density static random access memories (SRAMs). A static memory cell is characterized by operation in one of two mutually-exclusive and self-maintaining operating states. Each operating state defines one of the two possible binary bit values, zero or one. A static memory cell typically has an output which reflects the operating state of the memory cell. Such an output produces a "high" voltage to indicate a "set" operating state. The memory cell output produces a "low" voltage to indicate a "reset" operating state. A low or reset output voltage usually represents a binary value of zero, while a high or set output voltage represents a binary value of one.

Static memory cell 710 generally comprises first and second inverters 712 and 714 which are cross-coupled to form a bistable flip-flop. Inverters 712 and 714 are formed by n-channel driver transistors 716 and 717, and p-channel load transistors 718 and 719. Driver transistors 716 and 717 are typically n-channel metal oxide silicon field effect transistors (MOSFETs) formed in an underlying silicon semiconductor substrate. P-channel transistors 718 and 719 are typically thin film transistors formed above the driver transistors.

The source regions of driver transistors 716 and 717 are tied to a low reference or circuit supply voltage, labelled $V_{ss}$ and typically referred to as "ground." Load transistors 718 and 719 are connected in series between a high reference or circuit supply voltage, labelled $V_{cc}$, and the drains of the corresponding driver transistors 716 and 717. The gates of load transistors 718 and 719 are connected to the gates of the corresponding driver transistors 716 and 717.

Inverter 712 has an inverter output 720 formed by the drain of driver transistor 716. Similarly, inverter 714 has an inverter output 722 formed by the drain of driver transistor 717. Inverter 712 has an inverter input 724 formed by the gate of driver transistor 716. Inverter 714 has an inverter input 726 formed by the gate of driver transistor 717.

The inputs and outputs of inverters 712 and 714 are cross-coupled to form a flip-flop having a pair of complementary two-state outputs. Specifically, inverter output 720 is cross-coupled to inverter input 726, and inverter output 722 is cross-coupled to inverter input 724. In this configuration, inverter outputs 720 and 722 form the complementary two-state outputs of the flip-flop.

A memory flip-flop such as that described typically forms one memory element of an integrated array of static memory elements. A plurality of access transistors, such as access transistors 730 and 732, are used to selectively address and access individual memory elements within the array. Access transistor 730 has one active terminal connected to cross-coupled inverter output 720. Access transistor 732 has one active terminal connected to cross-coupled inverter output 722. A plurality of complementary column line pairs, such as the single pair of complementary column lines 734 and 736 shown, are connected to the remaining active terminals of access transistors 730 and 732, respectively. A row line 738 is connected to the gates of access transistors 730 and 732.

Reading static memory cell 710 involves activating row line 738 to connect inverter outputs 720 and 722 to column lines 734 and 736. Writing to static memory cell 710 involves first placing selected complementary logic voltages on column lines 734 and 736, and then activating row line 738 to connect those logic voltages to inverter outputs 720 and 722. This forces the outputs to the selected logic voltages, which will be maintained as long as power is supplied to the memory cell, or until the memory cell is reprogrammed.

Figure 2:
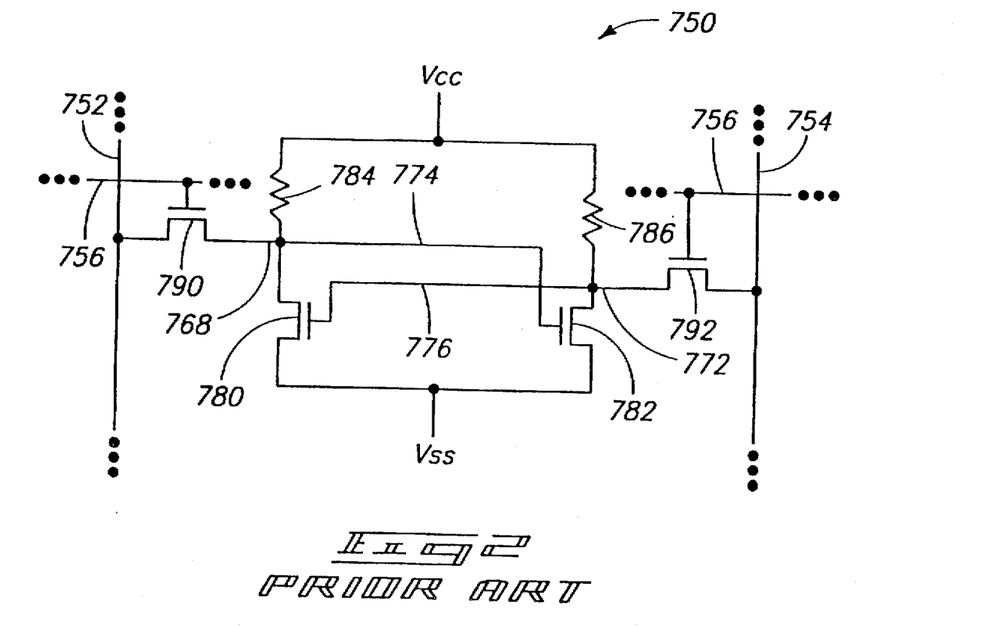
FIG. 2 is an alternate schematic of an alternate prior art SRAM cell.

FIG. 2 shows an alternative four transistor, dual wordline, prior art static read/write memory cell 750 such as is typically used in high-density static random access memories. Static memory cell 750 comprises n-channel pull-down (driver) transistors 780 and 782 having drains respectively connected to pull-up load elements or resistors 784 and 786. Transistors 780 and 782 are typically metal oxide silicon field effect transistors (MOSFETs) formed in an underlying silicon semiconductor substrate.

The source regions of transistors 780 and 782 are tied to a low reference or circuit supply voltage, labelled $V_{ss}$ and typically referred to as "ground." Resistors 784 and 786 are respectively connected in series between a high reference or circuit supply voltage, labelled $V_{cc}$, and the drains of the corresponding transistors 780 and 782. The drain of transistor 782 is connected to the gate of transistor 780 by line 776, and the drain of transistor 780 is connected to the gate of transistor 782 by line 774 to form a flip-flop having a pair of complementary two-state outputs.

A memory flip-flop, such as that described above in connection with FIG. 2, typically forms one memory element of an integrated array of static memory elements. A plurality of access transistors, such as access transistors 790 and 792, are used to selectively address and access individual memory elements within the array. Access transistor 790 has one active terminal connected to the drain of transistor 780. Access transistor 792 has one active terminal connected to the drain of transistor 782. A plurality of complementary column line pairs, such as the single pair of complementary column lines 752 and 754 shown, are connected to the remaining active terminals of access transistors 790 and 792, respectively. A row line 756 is connected to the gates of access transistors 790 and 792.

Reading static memory cell 750 involves activating row line 756 to connect outputs 768 and 772 to column lines 752 and 754. Writing to static memory cell 750 involves first placing selected complementary logic voltages on column lines 752 and 754, and then activating row line 756 to connect those logic voltages to outputs 768 and 772. This forces the outputs to the selected logic voltages, which will be maintained as long as power is supplied to the memory cell, or until the memory cell is reprogrammed.

A static memory cell is said to be bistable because it has two stable or self-maintaining operating states, corresponding to two different output voltages. Without external stimuli, a static memory cell will operate continuously in a single one of its two operating states. It has internal feedback to maintain a stable output voltage, corresponding to the operating state of the memory cell, as long as the memory cell receives power.

The two possible output voltages produced by a static memory cell correspond generally to upper and lower circuit supply voltages. Intermediate output voltages, between the upper and lower circuit supply voltages, generally do not occur except for during brief periods of memory cell power-up and during transitions from one operating state to the other operating state.

The operation of a static memory cell is in contrast to other types of memory cells such as dynamic cells which do not have stable operating states. A dynamic memory cell can be programmed to store a voltage which represents one of two binary values, but requires periodic reprogramming or "refreshing" to maintain this voltage for more than very short time periods.

A dynamic memory cell has no internal feedback to maintain a stable output voltage. Without refreshing, the output of a dynamic memory cell will drift toward intermediate or indeterminate voltages, resulting in loss of data. Dynamic memory cells are used in spite of a this limitation because of the significantly greater packaging densities which can be attained. For instance, a dynamic memory cell can be fabricated with a single MOSFET transistor, rather than the four or more transistors typically required in a static memory cell. Because of the significantly different architectural arrangements and functional requirements of static and dynamic memory cells and circuits, static memory design has developed along generally different paths than has the design of dynamic memories.

Figure 3:
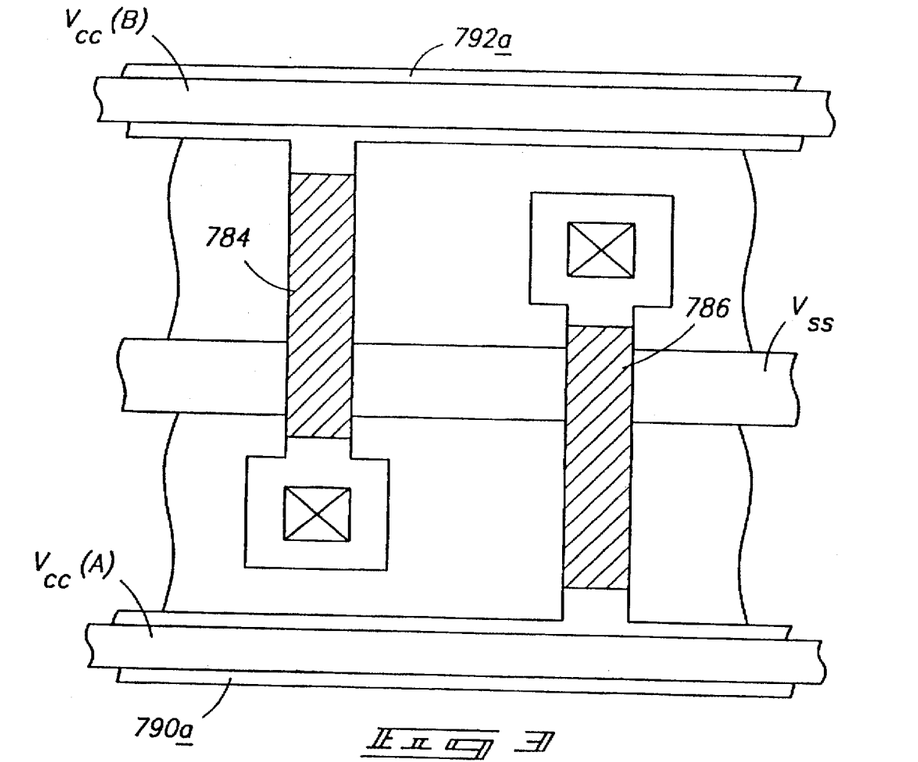
FIG. 3 is a diagrammatic top layout view of portions of a prior art SRAM cell.

FIG. 3 illustrates a typical top view of a prior art layout of portions of the FIG. 2 SRAM schematic pertinent to this disclosure. Such an SRAM cell employs two Vcc lines which are labeled respectively as Vcc(A) and Vcc(B). Lines 790a and 792a constitute the gate or wordlines of access devices 790 and 792, respectively. The two shaded areas 784 and 786 comprise the described pull-up resistors which are substantially horizontally formed as shown within the SRAM cell. Such horizontal positioning consumes considerable area within an individual SRAM cell, thus countering a desired goal of maximizing circuit density. Other examples of such similarly situated resistors can be found in U.S. Pat. No. 4,178,674 to Liu et al. and U.S. Pat. No. 4,828,629 to Akeda et al. Vertically oriented pull-up resistor constructions in SRAM cells have been proposed, such as is disclosed our U.S. Pat. No. 5,177,030.

This invention concerns improved SRAM construction employing vertically elongated pull-up resistors in SRAMs.

BRIEF DESCRIPTION OF THE DRAWINGS

Preferred embodiments of the invention are described below with reference to the following accompanying drawings.

FIG. 8 is a diagrammatic sectional layout view of the SRAM shown in FIG. 5, taken through line 8—8 in FIG. 5.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, an SRAM cell is having at least four field effect transistors comprises:

at least four transistor gates, a ground line, a Vcc line, and a pair of pull-up resistors; the four transistor gates having associated transistor diffusion regions operatively adjacent thereto; and the Vcc line and the ground line being provided in different respective elevational planes, the pull-up resistors being substantially vertically elongated between Vcc and selected of the respective transistor diffusion regions adjacent the gates.

In accordance with another aspect of the invention, an SRAM cell having at least four field effect transistors comprises:

at least four transistor gates, an electrical interconnect line, a Vcc line, and a pair of pull-up resistors; the four transistor gates having associated transistor diffusion regions operatively adjacent thereto; and the Vcc line and the electrical interconnect line being provided in different respective elevational planes, the pull-up resistors being substantially vertically elongated between Vcc and selected of the respective transistor diffusion regions adjacent the gates.

Figure 4:
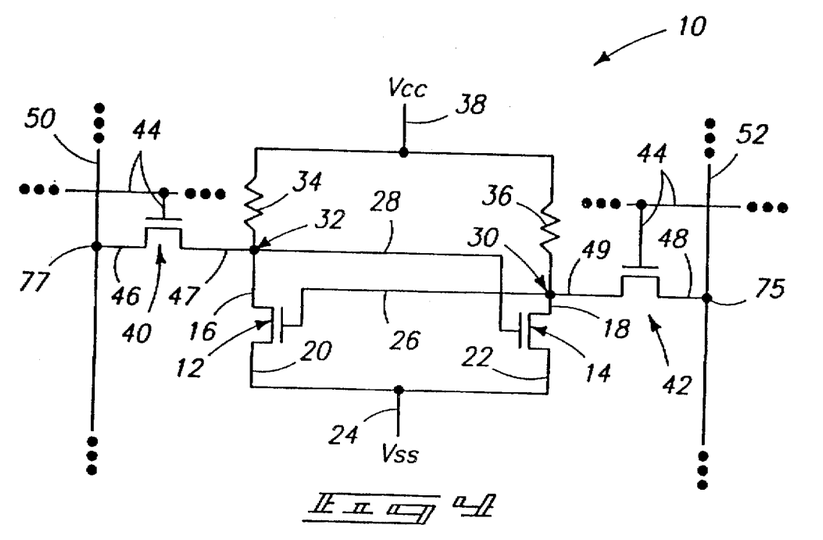
FIG. 4 is a schematic representation of one SRAM cell in accordance with the invention.

Referring initially to FIG. 4, an SRAM cell schematic is indicated generally with reference numeral 10. Such is essentially the same as the FIG. 2 schematic, comprising pull-down transistors 12 and 14 having associated drains and sources 16, 18 and 20, 22 respectively. Source regions 20 and 22 of pull-down transistors 12 and 14, respectively, are tied to a low reference or circuit supply voltage Vss 24 typically referred to as ground. Pull-down devices 12 and 14 include respective gate lines 26 and 28 which cross-couple to the drains 18, 16, respectively, of the opposing pull-down device 14, 16 respectively, at node locations 30 and 32, respectively. Pull-up resistors 34 and 36 are effectively electrically connected to drains 16 and 18 of pull-down devices 12 and 14, respectively, and cross-coupled gates 28 and 26 at node locations 32 and 30, respectively. Load resistors 34 and 36 are connected in series between a high reference or circuit supply voltage 38, indicated as Vcc.

A pair of access transistors 40 and 42 are provided to selectively address and access individual memory elements within the array. Access devices 40 and 42 comprise row or wordline gates 44, and associated active terminals 46, 47 and 48, 49, respectively. Regions 47 and 49 ohmically connect with nodes 32 and 30, respectively, and thus the drains 16, 18 of pull-down devices 12, 14, respectively, and gates 28, 26 of pull-down devices 14, 12, respectively. Column lines 50 and 52 connect with active terminals 46 and 48 of access devices 40 and 42 and nodes 77 and 75, respectively.

Thus in a preferred embodiment, SRAM cells having at least four field effect transistors 12, 14, 40 and 42 comprises a pair of memory cell wordlines 44, a pair of pull-down gates 26, 28, a ground line 24, a Vcc line 38 and a pair of pull-up resistors 34 and 36. Wordlines 44 and pull-down gates 26 and 28 have associated transistor diffusion regions 46, 47, 48, 49 and 16, 20, 18 and 22, respectively.

Reading static memory cell 10 involves activating wordlines 44 to connect outputs 32 and 30 to column lines 50 and 52, respectively. Writing to static memory cell 10 involves first placing selected complementary logic voltages on column lines 50 and 52, and then activating wordlines 44 to connect those logic voltages to outputs 32 and 30. This forces the outputs to the selected logic voltages, which will be maintained as long as power is supplied to the memory cell, or until the memory cell is reprogrammed.

Reference is now made to FIGS. 5–10 for an example preferred embodiment SRAM cell construction. Like numerals from the FIG. 4 schematic are utilized for the respective component constructions. As shown, the preferred embodiment SRAM cell 10 includes only one or a single $V_{cc}$ line 38 within the cell, contrary to the prior art embodiment of FIG. 3. Further, Vcc line 38 and ground line 24 are provided in different respective elevational planes. In the context of this disclosure, it is to be understood that a particular elevation of plane within the cell is not necessarily a constant horizontal plane, but may constitute a varying respective plane throughout the cell as the various respective components serpentine elevationally within the cell.

Figure 5:
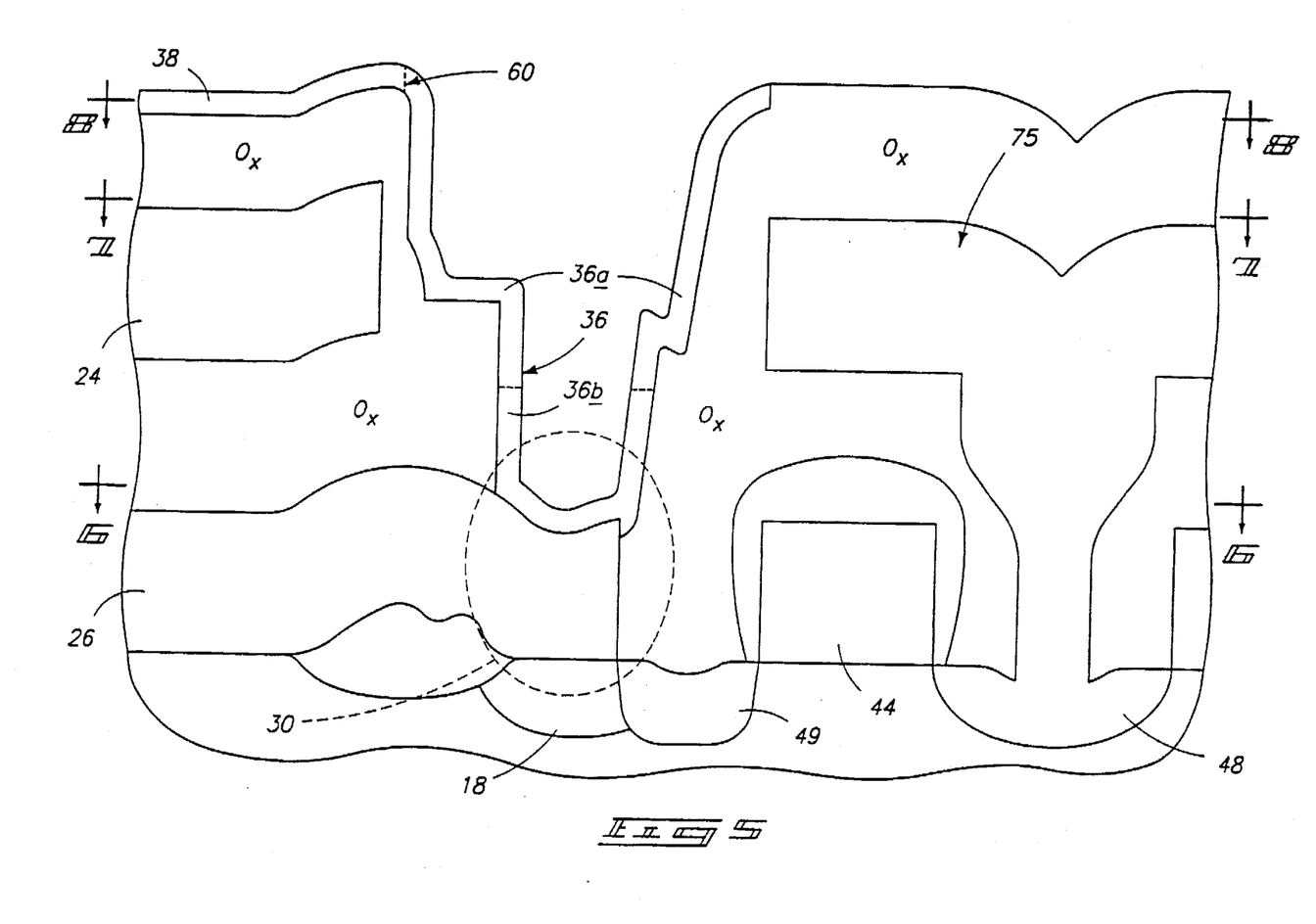
FIG. 5 is a diagrammatic sectional view of a portion of an SRAM cell in accordance with the invention cut positionally through lines X—X in FIGS. 6, 7 and 8.
Figure 6:
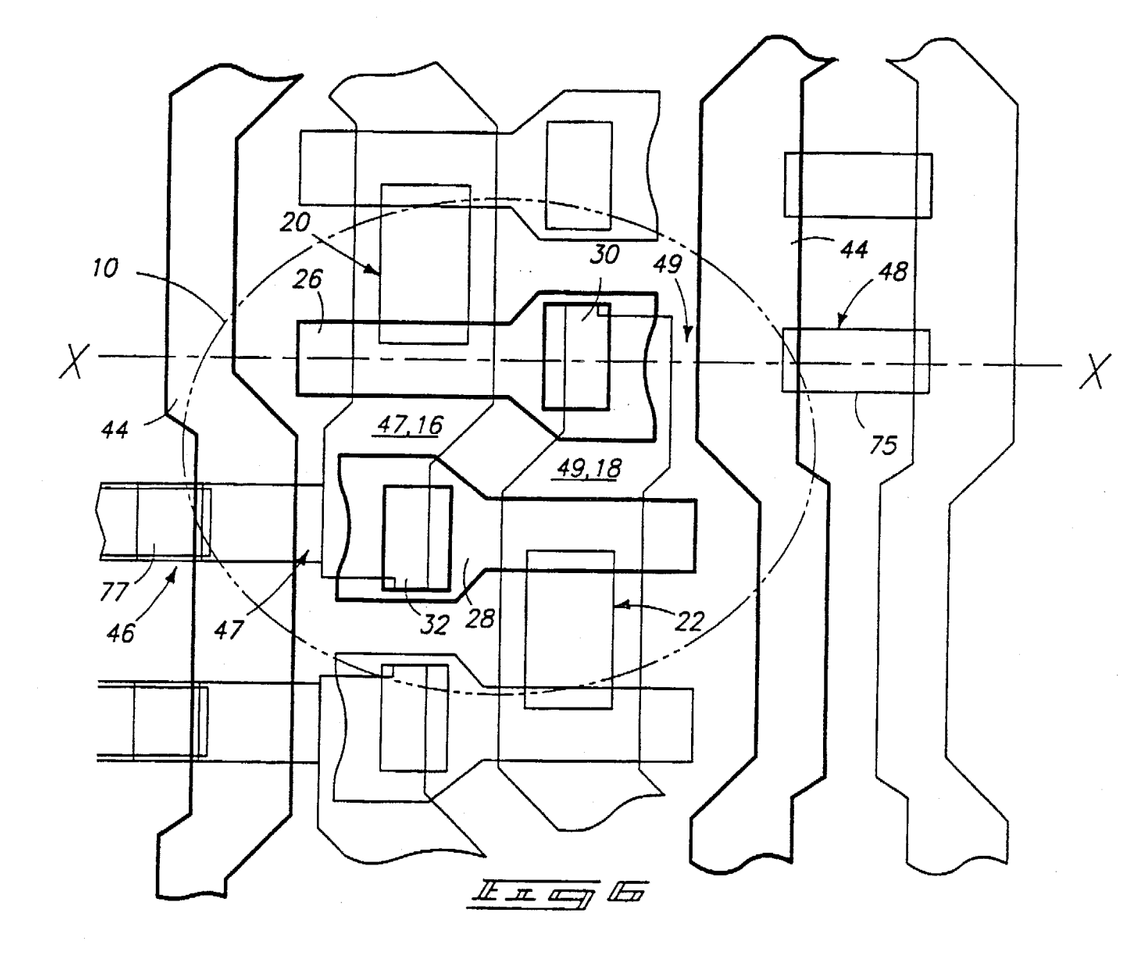
FIG. 6 is a diagrammatic sectional layout view of the SRAM shown in FIG. 5, taken through line 6—6 in FIG. 5.
Figure 7:
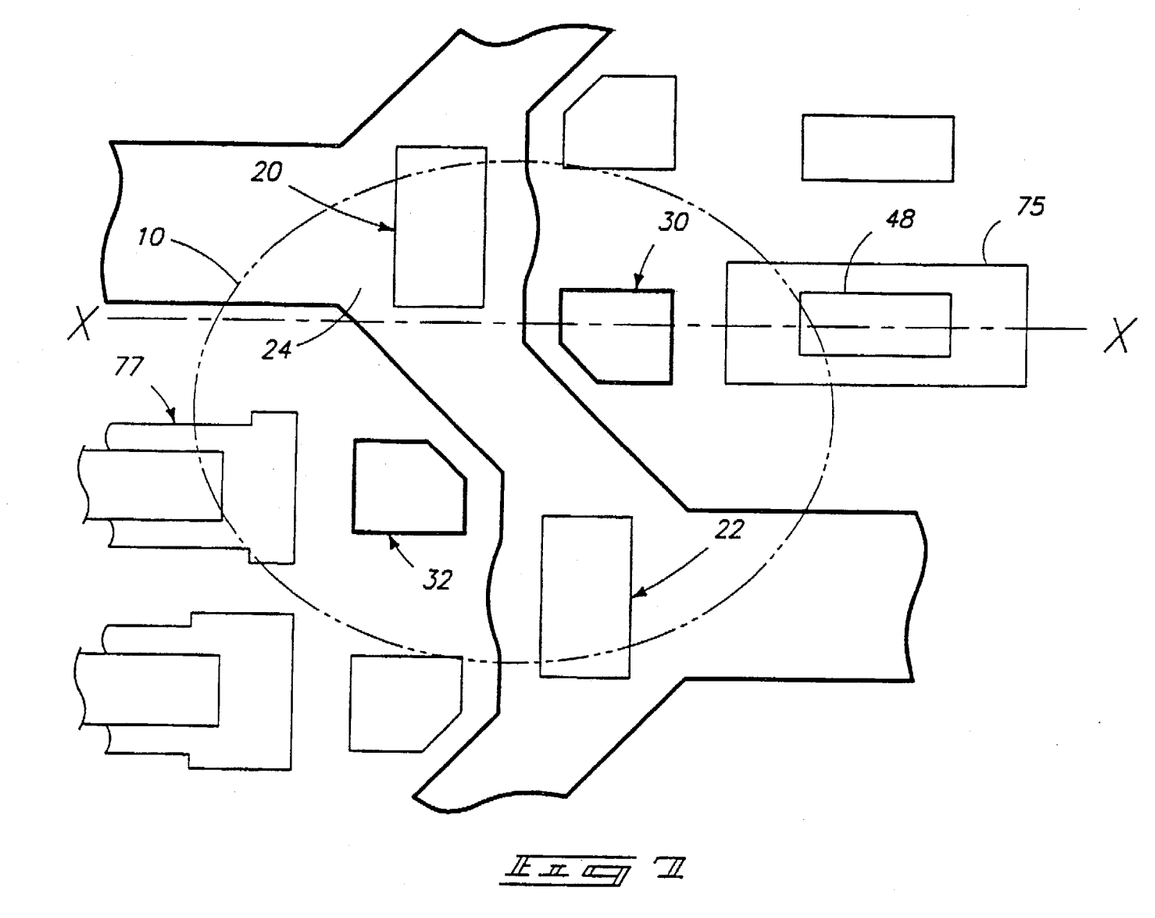
FIG. 7 is a diagrammatic sectional layout view of the SRAM shown in FIG. 5, taken through line 7—7 in FIG. 5.
Figure 9:
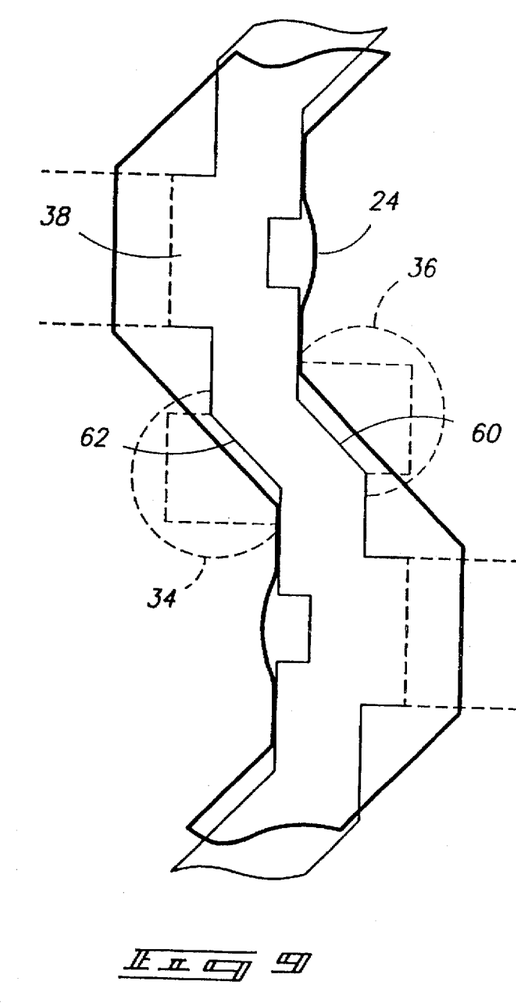
FIG. 9 is a diagrammatic top view of a portion of the FIG. 2 SRAM cell.
Figure 10:
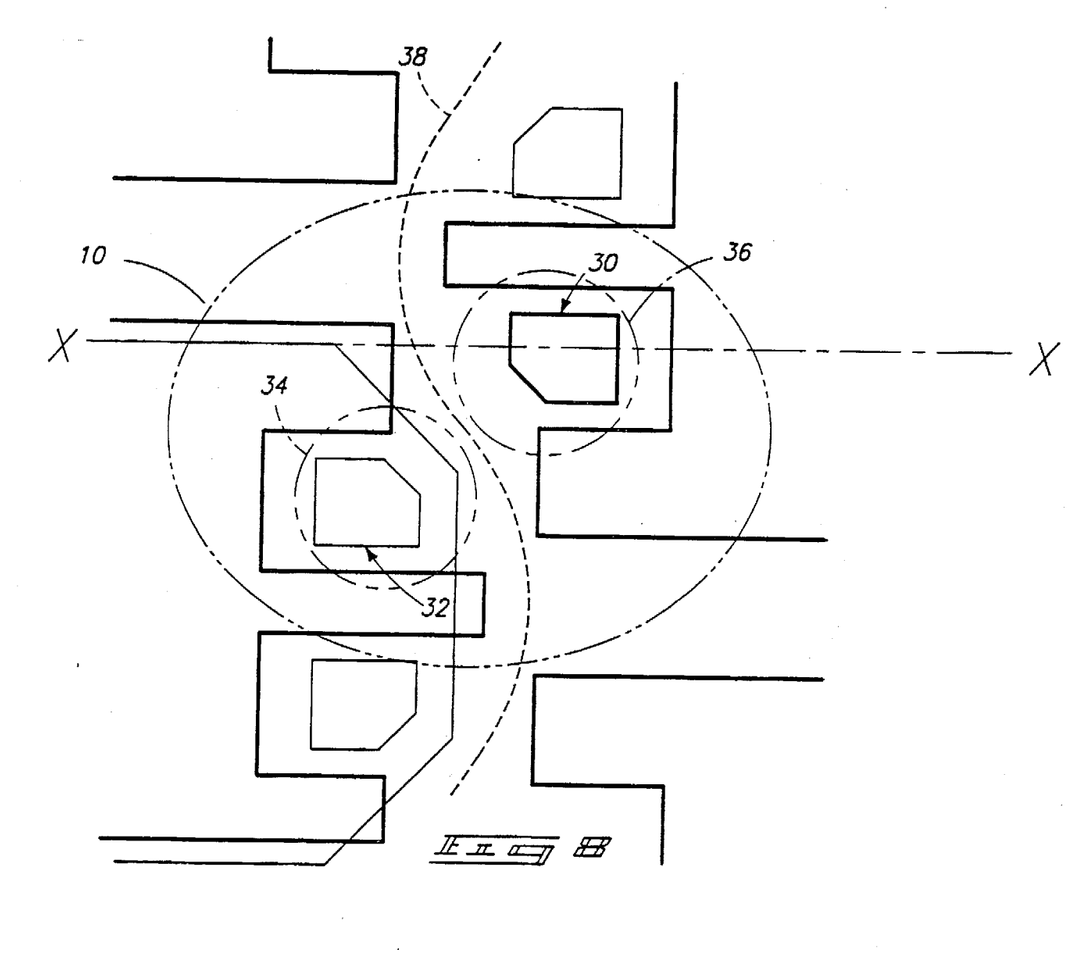
FIG. 10 is a greatly abbreviated diagram relative to the FIG. 2 SRAM cell.

Specifically, FIGS. 5, 7 and 8 collectively illustrate Vcc line 38 being in one higher or outer average plane in comparison to the average plane within which ground line 24 is provided. Thus in the preferred embodiment, Vcc line 38 is provided everywhere elevationally outward of ground line 24 throughout cell area 10. Further in the preferred embodiment, Vcc line 38 and ground line 24 elevationally overlap (FIG. 9), in contradistinction to the prior art embodiment of FIG. 3. Also as is most apparent from the diagrammatic FIGS. 9 and 10 representations, Vcc line 38 and ground line 24 have a common substantial shape in their respective elongated directions (FIG. 10) and substantially overlap (FIG. 9) throughout cell area 10.

Further as most apparent from FIG. 5, pull-up resistors 34 and 36 are substantially vertically elongated between Vcc line 38 and selected of the respective transistor diffusion regions operatively adjacent the pull-down gates and wordlines, such as the illustrated diffusion regions 49 and 18. In the depicted FIG. 5 embodiment, pull up resistor 36 connects with diffusion region 18 through gate line 36. Alternately, gate line 26 could be patterned in such a manner that region 18 is outwardly exposed, with pull up resistor 36 then inherently extending all the way to region 18 and electrically connecting laterally with gate line 26. Further in the depicted and preferred embodiment (FIGS. 5, 9), Vcc line 38 can be considered as having outer lateral edges 60 and 62 where it connects with pull-up resistors 36 and 34, respectively. Substantially vertically elongated pull-up resistors 36 and 34 are received substantially outward of Vcc line outer lateral edges 60 and 62, respectively, and effectively ohmically connect therewith.

Pull-up resistor 36 preferably comprises p-type regions 36a and n-type region 36b, with line 38 preferably being n-type. Such effectively forms resistor 36 to constitute a back-to-back diode construction. Alternately by way of example only, regions 38, 36a and 36b could be p/n/p, n+/n/n+, or p+/p/p+.

Also in accordance with the invention, ground line 24 can alternately be considered as an electrical interconnect line within memory cell 10. Also in accordance with the invention, an electrical interconnect line within memory cell 10 other than a ground line might be substituted in place of a ground/Vss function.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A dual wordline SRAM cell comprising:

a pair of memory cell wordlines, a pair of pull-down gates, an electrical interconnect line, a Vcc line, and a pair of pull-up resistors;

the wordlines and pull-down gates having associated transistor diffusion regions operatively adjacent thereto; and the Vcc line and the electrical interconnect line being provided in different respective elevational planes, the pull-up resistors being substantially vertically elongated between Vcc and selected of the respective transistor diffusion regions operatively adjacent the pull-down gates and wordlines.

2. The SRAM cell of claim 1 wherein the Vcc line is provided everywhere elevationally outward of the electrical interconnect line throughout the cell.

3. The SRAM cell of claim 1 wherein the Vcc line and the electrical interconnect line elevationally overlap.

4. The SRAM cell of claim 1 wherein the Vcc line and the electrical interconnect line have a common substantial shape in elongation and substantially elevationally overlap throughout the cell.

5. The SRAM cell of claim 1 wherein the Vcc line has outer lateral edges in locations where it connects with the respective pull-up resistors, the substantially vertically elongated pull-up resistors being received substantially outward of the Vcc line outer lateral edges and ohmically connecting therewith.

6. The SRAM cell of claim 1 having only one Vcc line in the cell.

7. The SRAM cell of claim 1 wherein the Vcc line and the electrical interconnect line have a common substantial shape in elongation and substantially elevationally overlap throughout the cell, and the Vcc line is provided everywhere elevationally outward of the electrical interconnect line throughout the cell.

8. The SRAM cell of claim 1 having only one Vcc line in the cell, the electrical interconnect line have a common substantial shape in elongation and substantially elevationally overlap throughout the cell, the one Vcc line is provided everywhere elevationally outward of the electrical interconnect line throughout the cell, and the one Vcc line has outer lateral edges in locations where it connects with the respective pull-up resistors, the substantially vertically elongated pull-up resistors being received substantially outward of the one Vcc line outer lateral edges and ohmically connecting therewith.

* * * * *